United States Patent [19]
Koh et al.

[11] Patent Number: 5,888,698
[45] Date of Patent: Mar. 30, 1999

[54] PHOTORESIST FILM FOR DEEP ULTRA VIOLET AND METHOD FOR FORMING PHOTORESIST FILM PATTERN USING THE SAME

[75] Inventors: Cha Won Koh; Cheol Kyu Bok, both of Ichon-shi, Rep. of Korea

[73] Assignee: Hyundai Electronics Industries Co., Ltd., Rep. of Korea

[21] Appl. No.: 864,113

[22] Filed: May 28, 1997

[30] Foreign Application Priority Data

Jun. 29, 1996 [KR] Rep. of Korea .................. 1996 25719

[51] Int. Cl.⁶ .............................. G03C 1/73; B05D 3/06
[52] U.S. Cl. .......................................... 430/281.1; 427/493
[58] Field of Search .................. 430/281.1, 496; 427/493; 428/221

[56] References Cited

U.S. PATENT DOCUMENTS 4,283,509 8/1981 Zweifel et al. ........................ 525/325
5,334,485 8/1994 Van Iseghem et al. ................ 430/287

FOREIGN PATENT DOCUMENTS 2314846 1/1988 United Kingdom .
2314847 1/1998 United Kingdom .
2318579 4/1998 United Kingdom .

Primary Examiner—Erma Cameron
Attorney, Agent, or Firm—Gary M. Nath; Nath & Associates

[57] ABSTRACT

A photoresist film superior in etch resistance and PED stability, as well as transmittance to deep UV, having a backbone of polymethylmethacrylate grafted with piperidine moiety of which the nitrogen atom acts as a base.

6 Claims, No Drawings

PHOTORESIST FILM FOR DEEP ULTRA VIOLET AND METHOD FOR FORMING PHOTORESIST FILM PATTERN USING THE SAME

BACKGROUND OF THE INVENTION

1. Field of the Invention

The present invention relates, in general, to a photoresist film for deep ultra violet (UV) and, more particularly, the use of a matrix resin of graft copolymer which has a desired combination of high transmittance of the backbone to deep UV with the etching resistance of the grafting moiety. Also, the present invention concerns a method for forming a photoresist film pattern by use of the photoresist film.

2. Description of the Prior Art

Usually, in order to form a pattern in a semiconductor device, a photoresist film is, first, coated on a layer to be etched and, then, patterned by exposing and developing processes. The resulting photoresist film pattern serves as a mask in etching the underlying layer.

As the integration degree of semiconductor devices becomes higher, finer photoresist film patterns are required. To satisfy this condition, chemical amplification resist films have been developed, which are found to be superior in resolution. However, the chemical amplification resist films have, in fact, not played a sufficient role in the fine pattern process using deep UV because they lack sufficiently high resolution, sensitivity, etch resistance, thermal stability, post exposure delay stability and process latitude.

A typical photoresist film comprises a matrix resin, a photo acid generator, and other additives. The matrix resin is required to be soluble to the solvent in use and show high thermal stability and low absorbance to the exposure wavelength in use in addition to having excellent etch resistance. In particular, this property is most important to photoresist film.

Matrix resins containing aromatic compounds show high etch resistance, but also high absorbance to ArF (193 nm). In contrast, non-aromatic matrix resins have a high absorbance property to ArF (193 nm), but show poor etch resistance. These contrasting weak points are one of the most troublesome factors retarding the development of excellent photoresist films for ArF.

SUMMARY OF THE INVENTION

An objective of the present invention is to overcome the above problems encountered in prior arts and to provide a photoresist film superior in etch resistance, as well as transmittance to deep UV.

Another objective of the present invention is to provide a method for forming a photoresist film pattern by use of the photoresist film.

In accordance with an aspect of the present invention, there is provided a photoresist film for deep UV comprising a resin, a photoacid generator and other additives, wherein the resin is a copolymer represented by the following structural formula I or II:

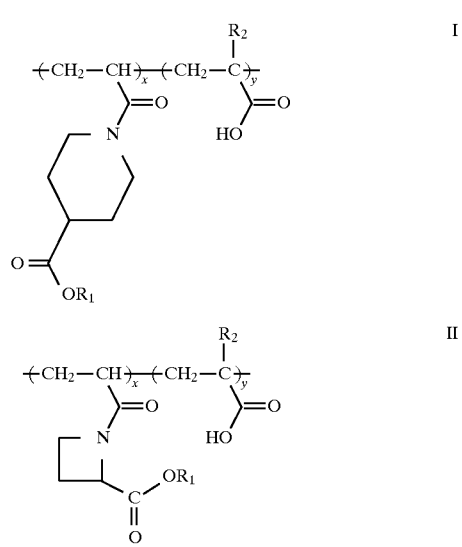

wherein x is a mole % of 50–90; y is a mole % of 10–50; $R_1$ functions as a dissolution inhibitor and is selected from the group consisting of methyl, ethyl and t-butyl; and $R_2$ is H or methyl.

In accordance with another aspect of the present invention, there is provided a method for forming a photoresist film pattern comprising the steps of coating on a substrate a photoresist film comprising the matrix resin of Structural formula I or II, soft-baking the coat and exposing the coat to a beam with a wavelength lower than 200 nm, post-baking the coat, and developing it.

DETAILED DESCRIPTION OF THE INVENTION

Among the components of chemical amplification resist film for ArF, matrix resin has the greatest influence on the property of the film.

The present invention pertains to a matrix resin for chemical amplification resist film for ArF which has a backbone of polymethylmethacrylate (PMMA) grafted with a piperidinecarboxylic acid, represented by the following structural formula I:

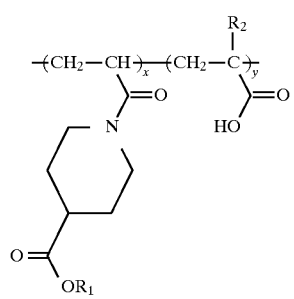

wherein x is a mole number of 50–90; y is a mole number of 10–50; $R_1$ is selected from the group consisting of methyl, ethyl and t-butyl; and $R_2$ is H or methyl. PMMA shows high transmittance to the light of 193 nm wavelength. The grafting 4-piperidinecarboxylic acid allows the matrix to be of high etch resistance, as well as of high PED stability because the nitrogen atom of the piperidine ring acts as a base in the latter case.

The matrix resin of Structural Formula I can be synthesized by the copolymerization of methacrylic acid with piperidine derivative as seen in the following reaction scheme I:

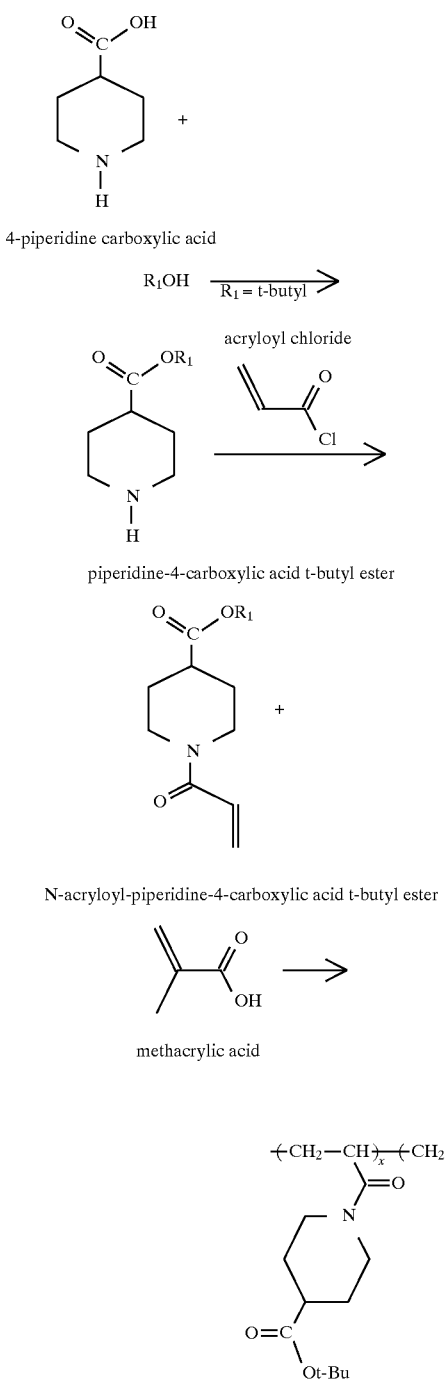

wherein $R_1OH$ represents methanol, ethanol or t-butanol.

This synthesis will be described in more detail in connection with Reaction Scheme I.

12.9 g of 4-piperidine carboxylic acid is completely dissolved in 35 ml of t-butyl alcohol ($R_1OH$) and refluxed for 10 hrs. in the presence of 3.8 g of para-toluene sulfonic acid. After being cooled to room temperature, the resulting reaction is washed three times with 20 ml of saturated $NaHCO_3$ and then, once with 25 ml of brine water and dried over $MgSO_4$ to give piperidine-4-carboxylic acid t-butyl ester.

Next, 20.3 g of piperidine-4-carboxylic acid t-butyl ester is dissolved in 100 ml of $CH_2Cl_2$ and cooled in an ice bath. Under a nitrogen atmosphere, 12 ml of triethylamine and then, 8.2 ml of acryloyl chloride solution in $CH_2Cl_2$ are added dropwise to the ester solution. This mixture is completely mixed by stirring for 5 hrs. Thereafter, this mixture is washed three times with 20 ml of 1 N HCl, washed another three times with 20 ml of $NaHCO_3$ and then washed once with 25 ml of brine water, and dried over $MgSO_4$ to obtain N-acryloyl-piperidine-4-carboxylic acid t-butyl ester.

Thereafter, 26.7 g of N-acryloyl-piperidine-4-carboxylic acid t-butyl ester is dissolved in 100 ml of $CH_2Cl_2$ and added to 4 g of methacrylic acid and 9 ml of N-ethyl morpholine. After being added dropwise with 7.2 g of dicyclohexylcarbodiimide in 30 ml of $CH_2Cl_2$, the solution mix is stirred at room temperature for 20 hrs and then, cooled in an ice bath. The precipitates thus obtained are filtered and added in 250 ml of ethyl acetate. Thereafter, this solution is washed three times with 20 ml of saturated $NaHCO_3$, washed another three times with 30 ml of 10% citric acid and then washed once with 25 ml of brine water, and dried over $MgSO_4$.

By reference, the synthesis of the matrix resin through the copolymerization of piperidine derivative with acrylic acid can be also accomplished in the same manner as the above procedure.

Also, the present invention pertains to a matrix resin for ArF which has a backbone of PMMA which shows high transmittance and a grafting group of 2-azetidine carboxylic acid moiety, represented by the following structural formula II:

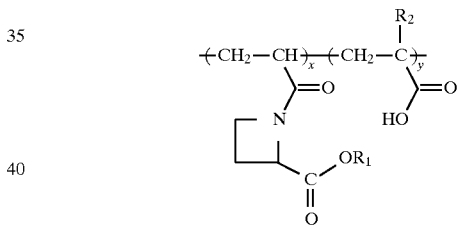

wherein x is a mole % W of 50–90; y is a mole % of 10–50; $R_1$ is selected from the group consisting of methyl, ethyl and t-butyl; and $R_2$ is H or methyl.

A photoresist film comprising the matrix resin of Structural Formula II is found to be of high etch resistance, as well as showing superior PED stability because the nitrogen atom in the piperidine ring acts as a base.

The matrix resin of Structural Formula II can be synthesized by reacting an azetidine derivative with a methacrylic acid in the manner of the following reaction scheme II:

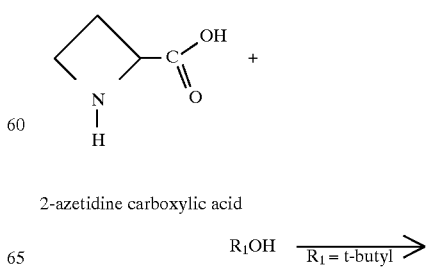

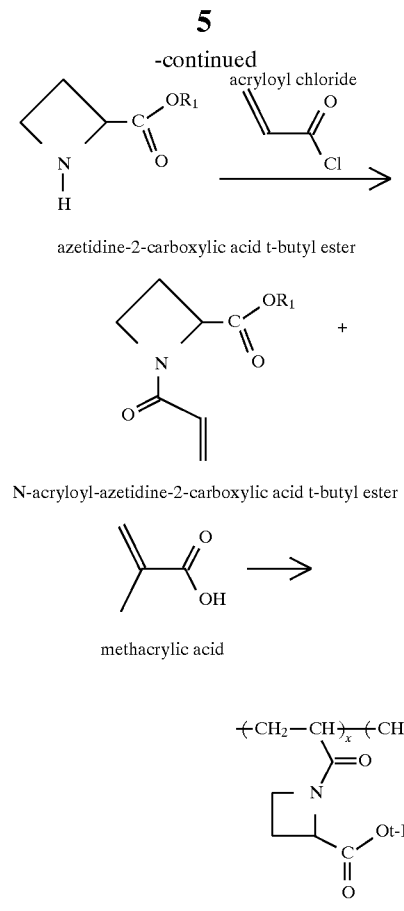

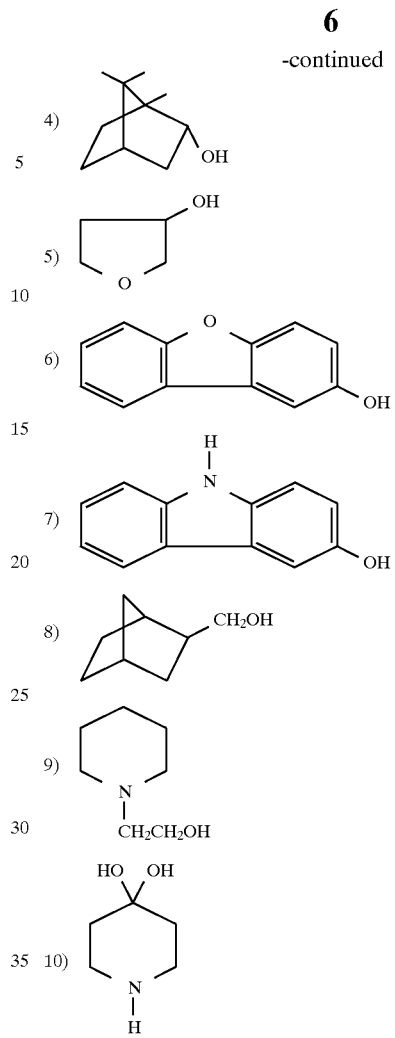

wherein $R_1OH$ represents methanol, ethanol or t-butanol.

The procedure of Reaction Scheme II is similar to that of Reaction Scheme I, except for the reactants used. Of course, the procedure of Reaction Scheme II can be made to the reaction of azetidine derivative with methacrylic acid.

With regard to the $R_1OH$ moiety which is used as a protecting group for the photoresist film resin of Structural Formulas I and II, detailed examples are given as shown in Structural Formula III:

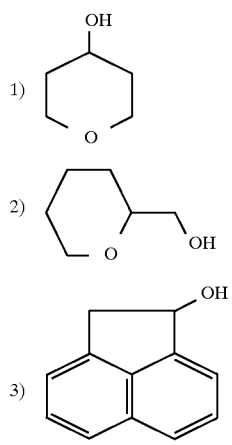

When a chemical amplification resist is exposed to light, activated acid induces a catalytic chain reaction to a photoresist film organic polymer, generating a significant amount of protons. In the resist, protons bring a large change into the solubility of the resin. When the photoresist film is irradiated by a high energy beam, e.g. 193 nm, acid ($H^+$) is generated, reacting with the matrix resin according to the present invention as shown in the following reaction formulas III and IV:

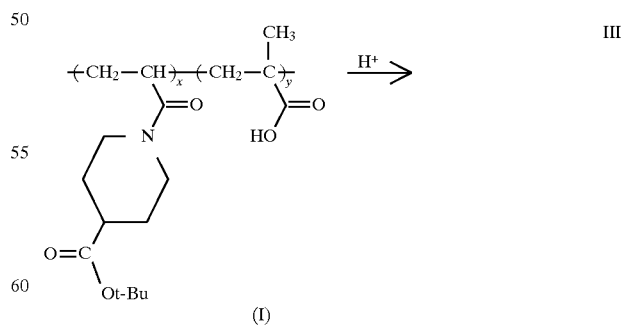

-continued

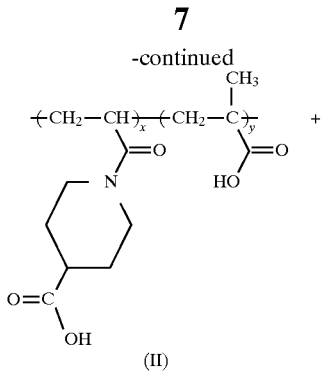

(II)

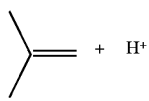

IV

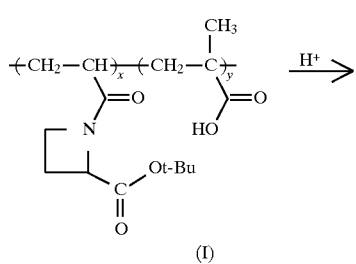

(I)

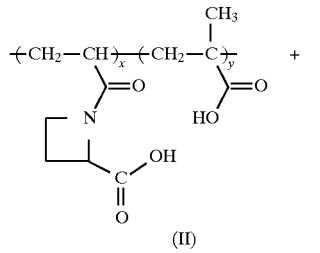

(II)

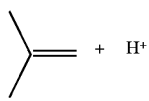

As seen, acid is again generated and reacts with Compound I, unreacted matrix resin. If this procedure is repeated many times, the matrix resin is changed into Compound II at the exposed region, which is dissolved in a developing solution. In contrast, the matrix resin at the non-exposed region maintains the structure of Compound I which is insoluble to the developing solution.

With such a mechanism, a good profile pattern can be made on a wafer substrate.

If chemical amplification resists are contaminated by base materials present in air, such as amine, the acid generated from the photoacid is lost, resulting in pattern deformation, such as T-top. In the present invention, the nitrogen atom of the piperidine ring acts as a base, protecting the pattern deformation attributable to the amine. Thus, PED stability can be increased according to the present invention.

In accordance with the present invention, a photoresist pattern is formed by coating a photoresist film comprising the matrix resin of Structural formula I or II on a substrate, soft-baking the coat and exposing the coat to a beam with a wavelength lower than 200 nm, post-baking the coat, and developing it.

It is preferred that the coat has a thickness of 0.5–1.2 μm. The soft-baking and the post-baking are carried out at a temperature of 70°–150° C. and 90°–160° C., respectively. The developing solution preferably has a concentration of 0.01–5 wt %.

As an alternative photoresist resin, a copolymer of proline derivative and methacrylic acid may be used.

In order to avoid the contamination of the amine, 2-azetidine carboxylic acid may be introduced in the matrix resin.

As described hereinbefore, the matrix resin of the present invention, having a backbone of polymethylmethacrylate grafted with 4-piperidinecarboxylic acid or 2-azetidine carboxylic acid, allows a photoresist film for deep UV superior in etch resistance and PED stability. This film is suitable for the preparation of 1 G and 4 G DRAM using ArF as a light source.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A photoresist film for deep UV with a wavelength of 200 nm or less comprising a resin, wherein said resin is a copolymer represented by the following structural formula I:

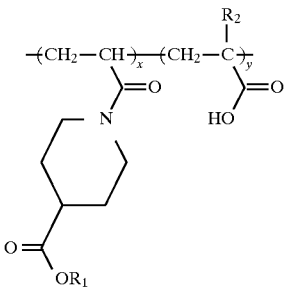

wherein x is a mole e of 50–90;

y is a mole % of 10–50;

$R_1$ is methyl, ethyl, t-butyl or a cyclic moiety.

2. A photoresist film for deep UV in accordance with claim 1, wherein said resin is synthesized by copolymerizing a piperidine derivative with a methacrylic acid.

3. A photoresist film for deep UV in accordance with claim 1, wherein said resin is synthesized by copolymerizing a piperidine derivative with an acrylic acid.

4. A photoresist film for deep UV in accordance with claim 2, wherein said resin is synthesized in the procedure of the following reaction scheme I:

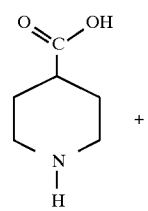

4-piperidine carboxylic acid

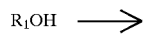

-continued
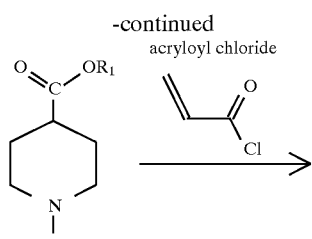
piperidine-4-carboxylic acid t-butyl ester
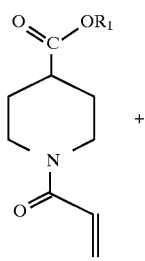
N-acryloyl-piperidine-4-carboxylic acid t-butyl ester
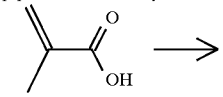
methacrylic acid
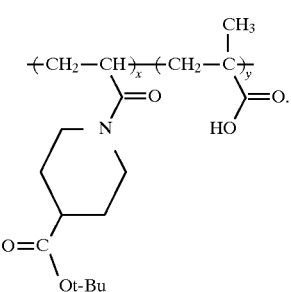
5. A photoresist film in accordance with claim 4 wherein $R_1$ comprises a cyclic moiety.
6. A photoresist film for deep UV in accordance with claim 5, wherein $R_1OH$ is selected from the group consisting of:
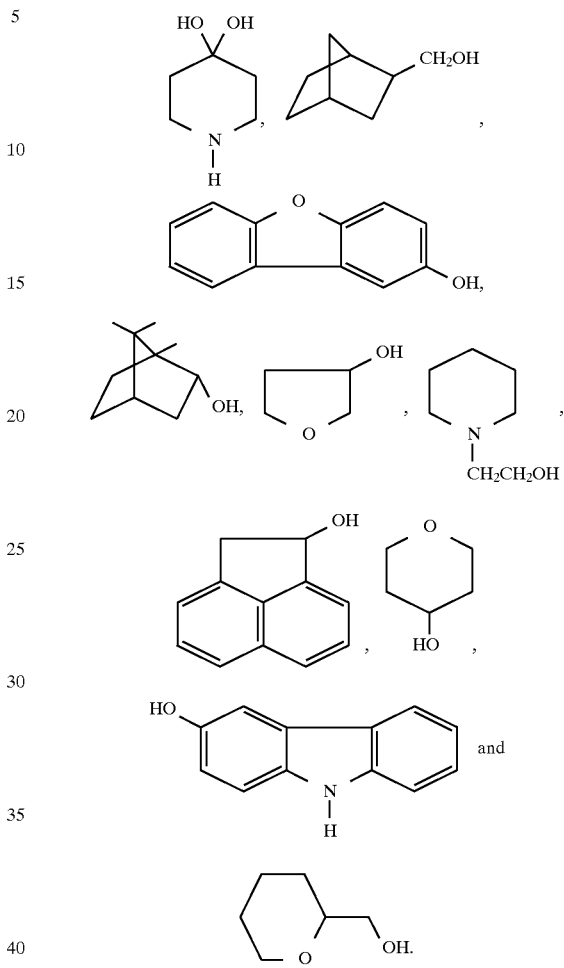
* * * * *

UNITED STATES PATENT AND TRADEMARK OFFICE
CERTIFICATE OF CORRECTION

PATENT NO.     : 5,888,698
DATED          : 03/30/99
INVENTOR(S)    : KOH et al

It is certified that error appears in the above-identified patent and that said Letters Patent is hereby corrected as shown below:

Claim 1, line 4 change "mole e" to --mole %--.

Signed and Sealed this

Second Day of November, 1999

Attest:

Q. TODD DICKINSON

Attesting Officer        Acting Commissioner of Patents and Trademarks